(12) United States Patent
Ohi

(10) Patent No.: US 8,399,340 B2
(45) Date of Patent: Mar. 19, 2013

(54) METHOD OF MANUFACTURING SUPER-JUNCTION SEMICONDUCTOR DEVICE

(75) Inventor: Akihiko Ohi, Matsumoto (JP)

(73) Assignee: Fuji Electric Co., Ltd., Kawasaki (JP)

( * ) Notice: Subject to any disclaimer, the term of this patent is extended or adjusted under 35 U.S.C. 154(b) by 97 days.

(21) Appl. No.: 13/157,764

(22) Filed: Jun. 10, 2011

(65) Prior Publication Data

US 2011/0306191 A1  Dec. 15, 2011

(30) Foreign Application Priority Data

Jun. 14, 2010  (JP) ................................. 2010-135185

(51) Int. Cl.
*H01L 21/00* (2006.01)

(52) U.S. Cl. ............ 438/495; 438/41; 438/44; 438/245; 438/341; 438/414; 438/481; 438/488; 438/505; 438/506; 257/E21.09; 257/E21.12

(58) Field of Classification Search .................. None
See application file for complete search history.

(56) References Cited

U.S. PATENT DOCUMENTS 6,589,336 B1 * 7/2003 Ebara et al. ...................... 117/94
6,611,021 B1   8/2003 Onishi et al.

FOREIGN PATENT DOCUMENTS

| JP | 05-343319 | 12/1993 |
| JP | 2001-119022 | 4/2001 |
| JP | 2008-130919 | 6/2008 |

* cited by examiner

*Primary Examiner* — Julio J Maldonado
*Assistant Examiner* — Yasser Abdelaziez

(57) ABSTRACT

A method of manufacturing a super-junction semiconductor device facilitates increasing the epitaxial growth rate without increasing the manufacturing steps greatly. In substitution for the formation of alignment mark in the surfaces of the second and subsequent non-doped epitaxial layers, patterning for forming a new alignment mark is conducted simultaneously with the resist pattering for selective ion-implantation into the second and subsequent non-doped epitaxial layers in order to form the new alignment mark at a position different from the position, at which the initial alignment mark is formed, and to form the new alignment mark in every one or more repeated epitaxial layer growth cycles.

5 Claims, 6 Drawing Sheets

METHOD OF MANUFACTURING SUPER-JUNCTION SEMICONDUCTOR DEVICE

CROSS-REFERENCE TO RELATED APPLICATION

This application claims the priority benefit of Japanese Patent Application No. 2010-135185, filed on Jun. 14, 2010, in the Japanese Intellectual Property Office, the disclosure of which is incorporated herein by reference.

BACKGROUND

1. Field

The present invention relates to a method of manufacturing a semiconductor device that includes a drift layer including an alternating-conductivity-type-layer. The alternating-conductivity-type-layer includes an n-type column and a p-type column, both extending in perpendicular to the major surface of a semiconductor substrate. The n-type column and the p-type column are arranged alternately and repeatedly in parallel to the major surface of the semiconductor substrate such that the n-type column and the p-type column are adjoining to each other. Hereinafter, the alternating-conductivity-type-layer is sometimes referred to as a "super-junction structure," and the semiconductor device including an alternating-conductivity-type-layer is referred to as a "super-junction semiconductor device."

2. Description of the Related Art

A super-junction MOSFET that is a vertical power MOSFET including a drift layer provided with a super-junction structure is know as one of the super-junction semiconductor devices.

Even if the impurity concentrations in the p-type and n-type columns constituting the drift layer provided with a super-junction structure in the super-junction semiconductor device are set to be higher than the impurity concentrations in the usual power semiconductor device of the same breakdown voltage class, depletion layers will expand from the pn-junction between the p-type and n-type columns to both sides in the OFF-state of the device. The depletion layers expanding from the pn-junction between the p-type and n-type columns to both sides in the OFF-state of the device deplete the p-type and n-type columns at a low electric field strength. Therefore, it is possible to provide the super-junction semiconductor device with a higher breakdown voltage. For providing the super-junction semiconductor device with a higher breakdown voltage, the charge balance between the p-type and n-type columns is important. In other words, it is desirable for the p-type and n-type columns to be charged electrically in the same extent.

As a result, the super-junction semiconductor device facilitates reducing the ON-state resistance, that is in the tradeoff relation against the breakdown voltage, to a value not only low enough to transcend the limit caused by the tradeoff relation but also low enough to transcend the theoretical limit of the material.

Japanese Unexamined Patent Application Publication No. 2001-119022 describes a method well known to persons skilled in the art for manufacturing the super-junction structure.

The method described in JP 2001-119022 includes the step of growing an epitaxial layer above a semiconductor substrate exhibiting low electrical resistance, the step of patterning a resist, and the steps of implanting p-type ions and n-type ions for forming a thin p-type column and a thin n-type column. This method repeats the step of growing, the step of patterning, and the steps of implanting multiple times until p-type columns of a desired thickness and n-type columns of the desired thickness are obtained. For forming the p-type columns and the n-type columns, both thick in perpendicular to the substrate surface, in an excellent fashion, it is necessary to lay a thin p-type column exactly on the p-type column already formed and a thin n-type column exactly on the n-type column already formed. In other words, it is necessary to align the p-type columns and the n-type columns with high positioning accuracy.

Now the conventional method of manufacturing a super-junction structure, that repeats the step of epitaxial growth, the step of resist patterning, and the steps of ion-implantation multiple times for stacking p-type columns and n-type columns in perpendicular to the substrate surface with a desired positioning accuracy, will be described below.

First, a silicon epitaxial layer (first layer) is grown for several μm above a silicon substrate exhibiting low electrical resistance and an alignment mark used in patterning the resist for ion-implantation is formed. The alignment mark is formed on a scribe line using a trench. Phosphorus ions are implanted into the entire epitaxial layer. A resist opening for defining a boron-ion-implanted region is formed by photolithography and boron ions are implanted through the resist opening. The resist is removed and a silicon epitaxial layer (second layer) is grown. Then, phosphorus ions are implanted into the entire second layer. Then, a resist patterning for defining the boron-ion-implanted region again is conducted. The initial alignment mark formed in the first layer surface and transferred to the second layer surface is used for the alignment mark for pattering the resist to position a boron-ion-implanted region in the second layer exactly on the boron-ion-implanted region in the first layer.

As described above, the step of epitaxial growth, the step of resist patterning, and the steps of ion-implantation are repeated multiple times for forming an alternating-conductivity-type-layer including a p-type column and an n-type column, positioned at the respective right positions, having a desired thickness, arranged alternately and repeatedly in parallel to the substrate surface such that the p-type column and the n-type column are adjoining to each other. The alternating-conductivity-type-layer forms a super-junction structure.

Japanese Unexamined Patent Application Publication No. Hei. 5 (1993)-343319 describes a method well known to persons skilled in the art for improving the accuracy of aligning the selectively-ion-implanted regions. The method described in JP 5-343319 relates to the alignment marks used in patterning the selectively-ion-implanted regions formed in the silicon epitaxial layers grown above a silicon substrate of low electrical resistance. The alignment marks are formed in the surfaces of the silicon epitaxial layers. This method forms a new alignment mark in the second layer at a position different from the alignment mark position transferred to the second layer from the first layer. The use of a new alignment mark in the second layer at a position different from the alignment mark position transferred to the second layer from the first layer improves the alignment accuracy as compared with the use of the alignment mark transferred from the first layer to the second layer.

JP 5-343319 also describes an etching method for sharpening the boundary of the transferred alignment mark blunted by every epitaxial layer growth to be clear enough for an effective next mask alignment.

Japanese Unexamined Patent Application Publication No. 2008-130919 describes the preferable use of KOH for an etchant that corrects to sharpen the blunted alignment mark boundary.

For forming the alignment mark in the second layer at a position different from the position, at which the alignment mark in the first layer is formed, to improve the alignment accuracy as described in JP 5-343319, it is necessary to add a new alignment step for forming the alignment mark in the second layer.

If the epitaxial layer growth rate is made to be low, the deformation or the bluntness caused on the alignment mark will be reduced. As a result, the transferred alignment mark in the second epitaxial layer surface transferred from the initial alignment mark is deformed or blunted only a little. Therefore, the transferred alignment mark is used without correction for the alignment on the second and subsequent epitaxial layers with high accuracy. In the device exhibiting a high breakdown voltage, the thick drift layer thereof is formed by laminating many epitaxial layers. If the epitaxial growth rate is set to be low, it will take a too long time to grow the epitaxial layers. Therefore, the low epitaxial growth rate is not preferable.

If an alignment mark is formed after every epitaxial layer growth, an alignment may be conducted with high accuracy and the epitaxial growth rate may be made to be high. However, it will be necessary to add many cumbersome alignment steps.

In view of the foregoing, it would be desirable to obviate the problems described above. It would be also desirable to provide a method of manufacturing a super-junction semiconductor device that facilitates increasing the epitaxial growth rate without increasing the manufacturing steps greatly.

SUMMARY

Additional aspects and/or advantages will be set forth in part in the description which follows and, in part, will be apparent from the description, or may be learned by practice of embodiments of the invention.

According to a first aspect of the invention, there is provided a method of manufacturing a super-junction semiconductor device, the method including the steps of:
(a) growing an epitaxial layer above a heavily doped semiconductor substrate of a first conductivity type;
(b) forming an alignment mark in the surface of the epitaxial layer;
(c) implanting impurity ions of the first conductivity type or a second conductivity type into the entire epitaxial layer;
(d) patterning a resist by photolithography, the resist being used in selective impurity ion implantation into the epitaxial layer;
(e) implanting impurity ions of the second conductivity type or the first conductivity type selectively through the resist patterned;
(f) repeating a step cycle including the steps (a), (c), (d), and (e) multiple times for forming a drift layer having a desired thickness, the drift layer including an alternating-conductivity-type-layer which includes a first column of the first conductivity type and a second column of the second conductivity type, the first column and the second column extending in perpendicular to a substrate major surface, the first column and the second column being arranged alternately and repeatedly in parallel to the substrate major surface such that the first column and the second column are adjoining to each other;
(g) conducting patterning for forming a new alignment mark simultaneously with patterning the resist used in the selective impurity ion implantation;
(h) forming the new alignment mark at a position different from the position, at which the alignment mark in the preceding epitaxial layer is formed;
the step (g) being conducted simultaneously with the step (d) in every one or more repeated step cycles; and
the step (h) being conducted in subsequent to the step (g) and in advance to the step (e) in the every one or more repeated step cycles.

Preferably, the alignment mark or the new alignment mark is formed in the surface portion on the scribed line of a semiconductor wafer including one or more epitaxial layers above the semiconductor substrate, and the alignment mark or the new alignment mark is a trench 0.3 µm or less in depth.

According to a second aspect of the invention, there is provided a method of manufacturing a super-junction semiconductor device, the method including the steps of:
(a) growing a non-doped epitaxial layer above a heavily doped semiconductor substrate of a first conductivity type;
(b) forming an alignment mark in the surface of the non-doped epitaxial layer;
(c) implanting impurity ions of the first conductivity type or a second conductivity type into the entire epitaxial layer;
(d) patterning a resist by photolithography, the resist being used in selective impurity ion implantation into the epitaxial layer;
(e) implanting impurity ions of the second conductivity type or the first conductivity type selectively through the resist patterned;
(f) repeating a step cycle including the steps (a), (c), (d), and (e) multiple times for forming a drift layer having a desired thickness, the drift layer including an alternating-conductivity-type-layer which includes a first column of the first conductivity type and a second column of the second conductivity type, the first column and the second column extending in perpendicular to a substrate major surface, the first column and the second column being arranged alternately and repeatedly in parallel to the substrate major surface such that the first column and the second column are adjoining to each other;
(g) etching the surface of the non-doped epitaxial layer, to which the alignment mark in the preceding epitaxial layer surface is transferred, by isotropic etching, and
the step (g) being conducted in subsequent to the step (a) in every one or more repeated step cycles.

Preferably, the etching amount by the isotropic etching is 0.5 µm or less in depth from the surface of the non-doped epitaxial layer.

According to embodiments of the invention, a method of manufacturing a super-junction semiconductor device, that facilitates increasing the epitaxial growth rate without increasing the manufacturing steps greatly, is obtained.

BRIEF DESCRIPTION OF THE DRAWINGS

These and/or other aspects and advantages will become apparent and more readily appreciated from the following description of the embodiments, taken in conjunction with the accompanying drawings of which.

DESCRIPTION OF EMBODIMENTS

Figure 1:
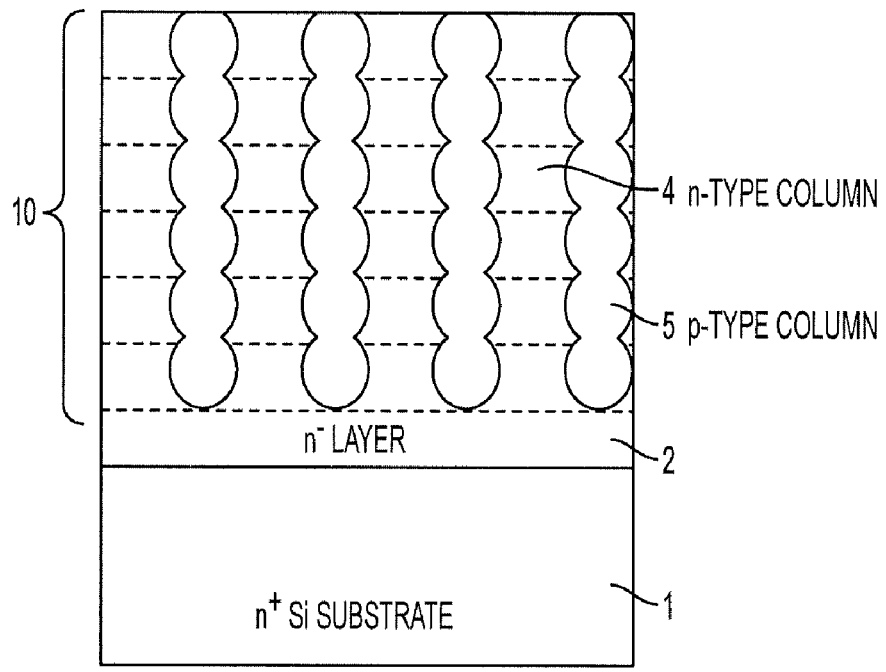
FIG. 1 is a cross sectional view schematically showing a super-junction semiconductor wafer according to a first embodiment of the invention.

Reference will now be made in detail to the embodiments, examples of which are illustrated in the accompanying drawings, wherein like reference numerals refer to the like elements throughout. The embodiments are described below to explain the present invention by referring to the figures.

Now embodiments of the invention will be described in detail hereinafter with reference to the accompanied drawings which illustrate preferred embodiments.

Although the invention will be described in connection with the embodiments thereof, changes and modifications are obvious to the persons skilled in art without departing from the true spirits of the invention. Therefore, the invention should be understood not by the specific descriptions herein, but by the appended claims thereof.

The suffix "+" on the shoulder of the letter "n" or "p" indicating the conductivity type of a layer or a region indicates that the layer or the region is doped relatively heavily. The suffix "−" on the shoulder of the letter "n" or "p" indicating the conductivity type of a layer or a region indicates that the layer or the region is doped relatively lightly.

First Embodiment

FIG. 1 is a cross sectional view schematically showing a super-junction semiconductor wafer according to a first embodiment of the invention.

Referring now to FIG. 1, n$^-$ layer 2 working as a buffer layer is formed on n$^+$ Si substrate 1. Super-junction structure 10 is formed on n$^-$ layer 2. Super-junction structure 10 includes n-type column 4 and p-type column 5, both extending in perpendicular to the substrate surface. The n-type column 4 and p-type column 5 are arranged alternately and repeatedly in parallel to the substrate surface such that n-type column 4 and p-type column 5 are adjoining to each other.

FIGS. 2 through 7 are cross sectional views describing the steps for manufacturing the super-junction wafer shown in FIG. 1.

Figure 2:
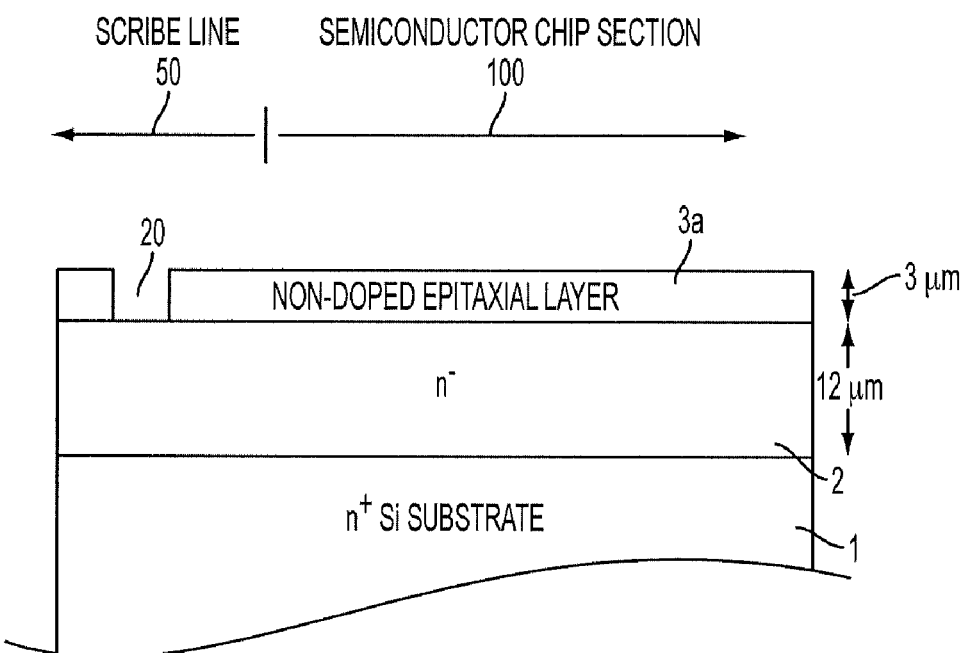
FIG. 2 is a first cross sectional view describing an initial step for manufacturing the super-junction semiconductor wafer shown in FIG. 1.

Referring now to FIG. 2, n$^-$ layer 2, the impurity concentration therein is $3 \times 10^{14}$ cm$^{-3}$, is formed for the thickness of around 12 μm on n$^+$ Si substrate 1 by silicon epitaxial growth.

Non-doped epitaxial layer 3a is formed on n$^-$ layer 2 for the thickness of, for example, 3 μm by silicon epitaxial growth.

In the surface portion, allocated for scribe line 50 between semiconductor chip sections 100, of the wafer including non-doped epitaxial layer 3a formed therein, first alignment mark 20 used as a reference for the alignment in each stage is formed by photolithography and by trench etching.

Figure 3:
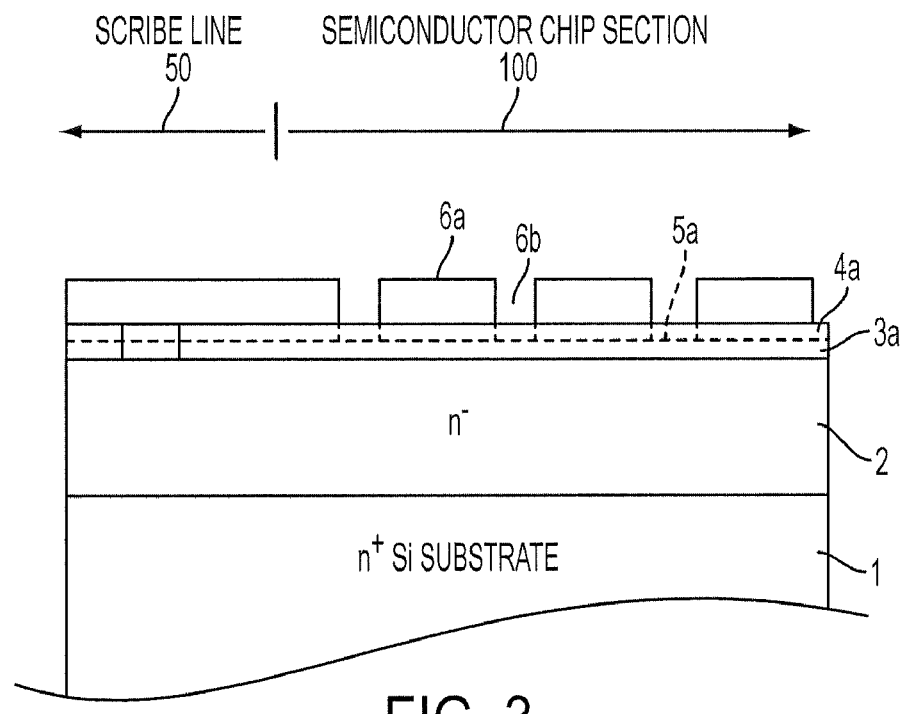
FIG. 3 is a second cross sectional view describing the step for manufacturing the super-junction semiconductor wafer subsequent to the step described in FIG. 2.

Referring now to FIG. 3, n-type impurity ions, e.g. phosphorus ions 4a, are implanted into entire non-doped epitaxial layer 3a as shown by a broken line. Then, p-type impurity ions, e.g. boron ions 5a, are implanted selectively through resist opening 6b formed in resist mask 6a formed by photolithography. Considering the expansion caused by the thermal diffusion in the subsequent step, the resist opening 6b width is set to be around one-fourth of the remaining resist mask 6a. In accordance with the resist opening width setting, the implanted boron amount is set to be four times as large as the implanted phosphorus amount to balance the electric charges between p-type column 5 and n-type column 4.

Figure 4:
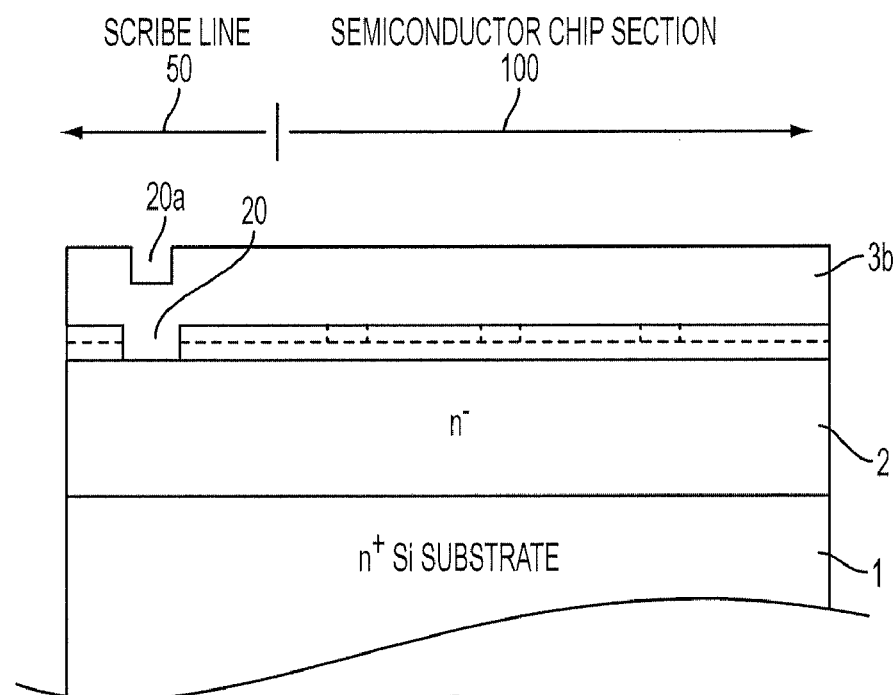
FIG. 4 is a third cross sectional view describing the step for manufacturing the super-junction semiconductor wafer subsequent to the step described in FIG. 3.

Referring now to FIG. 4, second non-doped epitaxial layer 3b is formed for the thickness of 7 μm by silicon epitaxial growth. Although not illustrated in FIG. 4, phosphorus ions 4b are implanted into entire non-doped epitaxial layer 3b in the same manner as in the first layer. Resist openings are formed by photolithography through the resist mask for forming boron-ion-implanted regions. On scribe line 50 in the non-doped epitaxial layer 3b surface, transferred alignment mark 20a is transferred from first alignment mark 20 in such a manner that transferred alignment mark 20a is deformed a little bit from first alignment mark 20 and narrower than first alignment mark 20.

Figure 5:
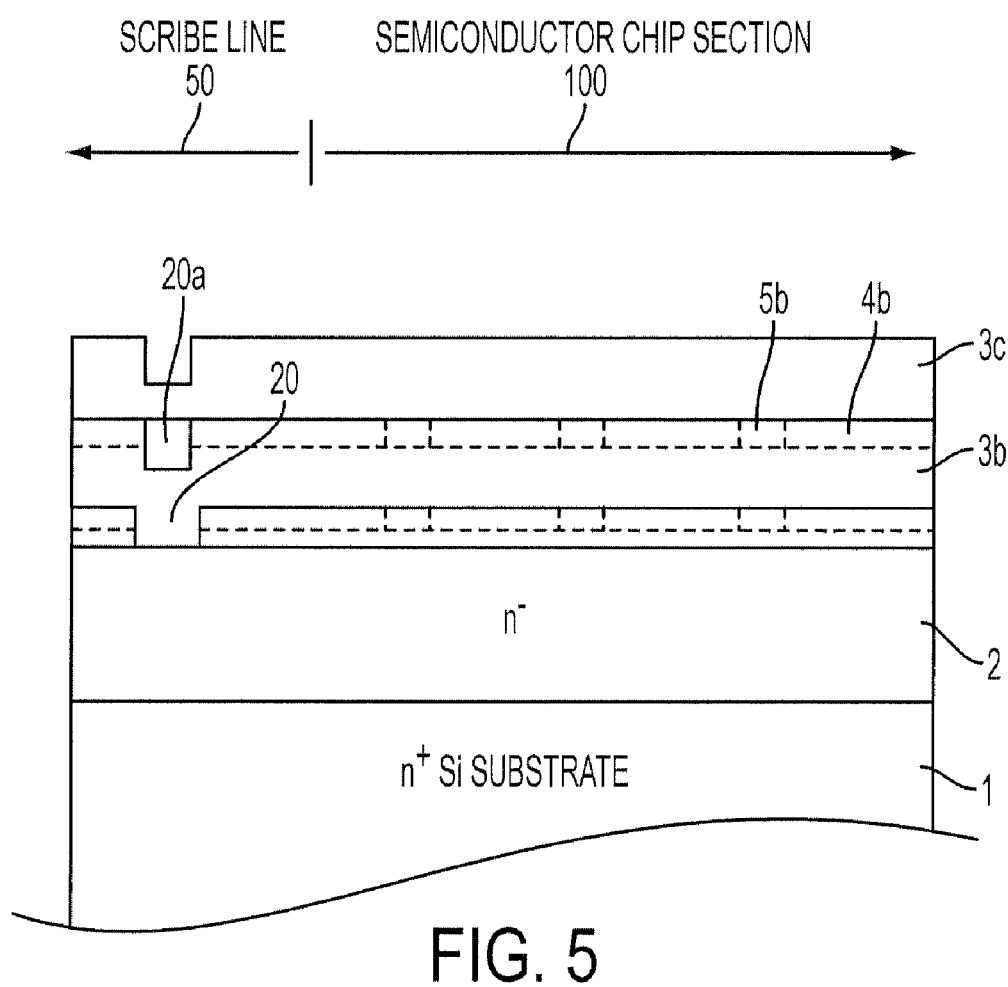
FIG. 5 is a fourth cross sectional view describing the step for manufacturing the super-junction semiconductor wafer subsequent to the step described in FIG. 4.

For aligning the first and second alternating-conductivity-type-layers (first and second layers), transferred alignment mark 20a is used. Referring now to FIG. 5, boron ions 5b are implanted through the resist openings formed for forming the ion-implanted regions.

Then, third non-doped epitaxial layer 3c (third layer) is formed for the thickness of 7 μm by silicon epitaxial growth as shown in FIG. 5. First alignment mark 20 is deformed further by the lamination of third non-doped epitaxial layer 3c and transferred to the third non-doped epitaxial layer 3c surface in the form of transferred alignment mark 20b, the width thereof is further reduced.

Figure 6A:
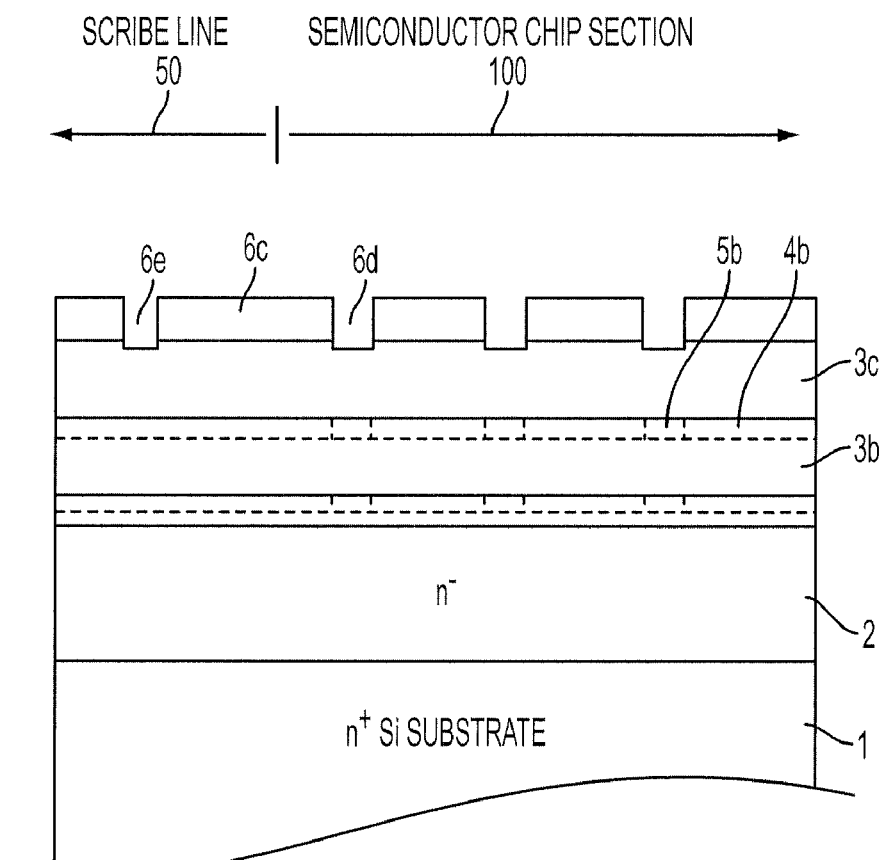
FIG. 6A is a fifth cross sectional view describing the step for manufacturing the super-junction semiconductor wafer subsequent to the step described in FIG. 5.

Referring now to FIG. 6A, resist mask 6c and resist opening 6d for forming a boron-ion implanted region in third non-doped epitaxial layer 3c are formed by photolithography. The photolithography for the third epitaxial layer is different from the photolithography for the second epitaxial layer. In the photolithography for the third epitaxial layer, the patterning for forming resist opening 6e for forming second alignment mark 21 at a position different from the position, at which first alignment mark 20 is formed, is conducted simultaneously with the patterning for forming resist opening 6d for forming the boron-ion-implanted region described above.

The simultaneous patterning is the specific feature of embodiments of the present invention. The simultaneous patterning facilitates omitting the photolithographic step solely for forming second alignment mark 21.

Figure 6B:
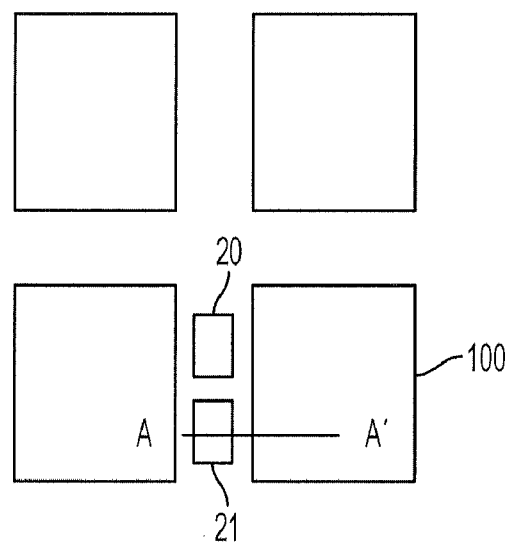
FIG. 6B is a top plan view showing the arrangements of the first and second alignment marks and the semiconductor chip sections in the semiconductor wafer according embodiments to the invention.

Then, the silicon surface exposed to resist opening 6d and the silicon surface exposed to opening 6e for forming second alignment mark 21 are etched for the depth of 0.1 μm to form second alignment mark 21. The silicon surface exposed to resist opening 6d and the silicon surface exposed to opening 6e are the non-doped epitaxial layer 3c surface. FIG. 6B is a top plan view showing the arrangements of the first and second alignment marks and semiconductor chip sections 100 in the wafer. The cross sectional view along the line segment A-A' in FIG. 6B is shown in FIGS. 6A and 7.

Figure 7:
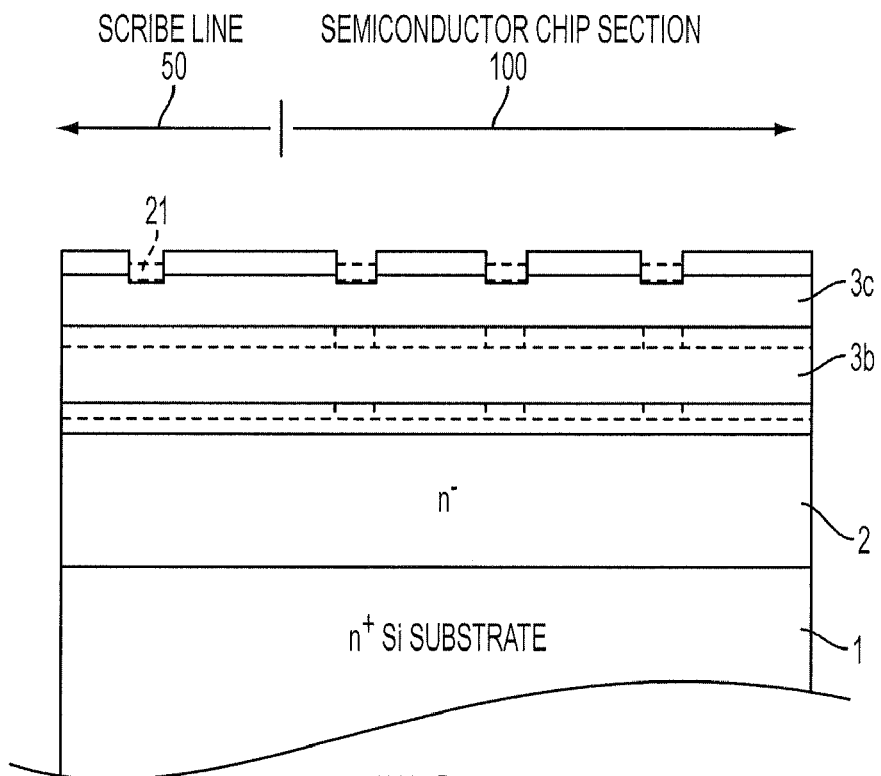
FIG. 7 is a sixth cross sectional view describing the step for manufacturing the super-junction semiconductor wafer subsequent to the step described in FIG. 6A.

After boron ions are implanted into non-doped epitaxial layer 3c in FIG. 6A, resist mask 6c is peeled off as shown in FIG. 7 and phosphorus ions are implanted into the entire wafer. Thus, second alignment mark 21 is formed at a position on scribed line 50 different from the position on scribed line 50, at which alignment mark 20b is transferred from first alignment mark 20.

Since the preceding descriptions are repeated in the following descriptions, the following descriptions will be made with reference to no drawings.

A fourth non-doped epitaxial layer is grown, ions are implanted and pattering is conducted. For improving the alignment accuracy in the pattering, a transferred alignment mark transferred from second alignment mark 21 to the fourth non-doped epitaxial layer surface is employed.

In the fifth non-doped epitaxial layer, a third alignment mark different from the first and second alignment marks is formed on scribed line 50 in the same manner as the second alignment mark in the third non-doped epitaxial layer. Thus, the non-doped epitaxial layer growth for forming the second and third layers, ion implantation, pattering, and alignment mark formation are repeated until an alternating-conductivity-type-layer having a desired thickness is obtained. The alternating-conductivity-type-layer having the desired thickness is capped with a non-doped layer of around 5 μm in thickness. Then, the implanted boron ions and phosphorus ions are diffused thermally to form a super-junction structure.

Figure 9:
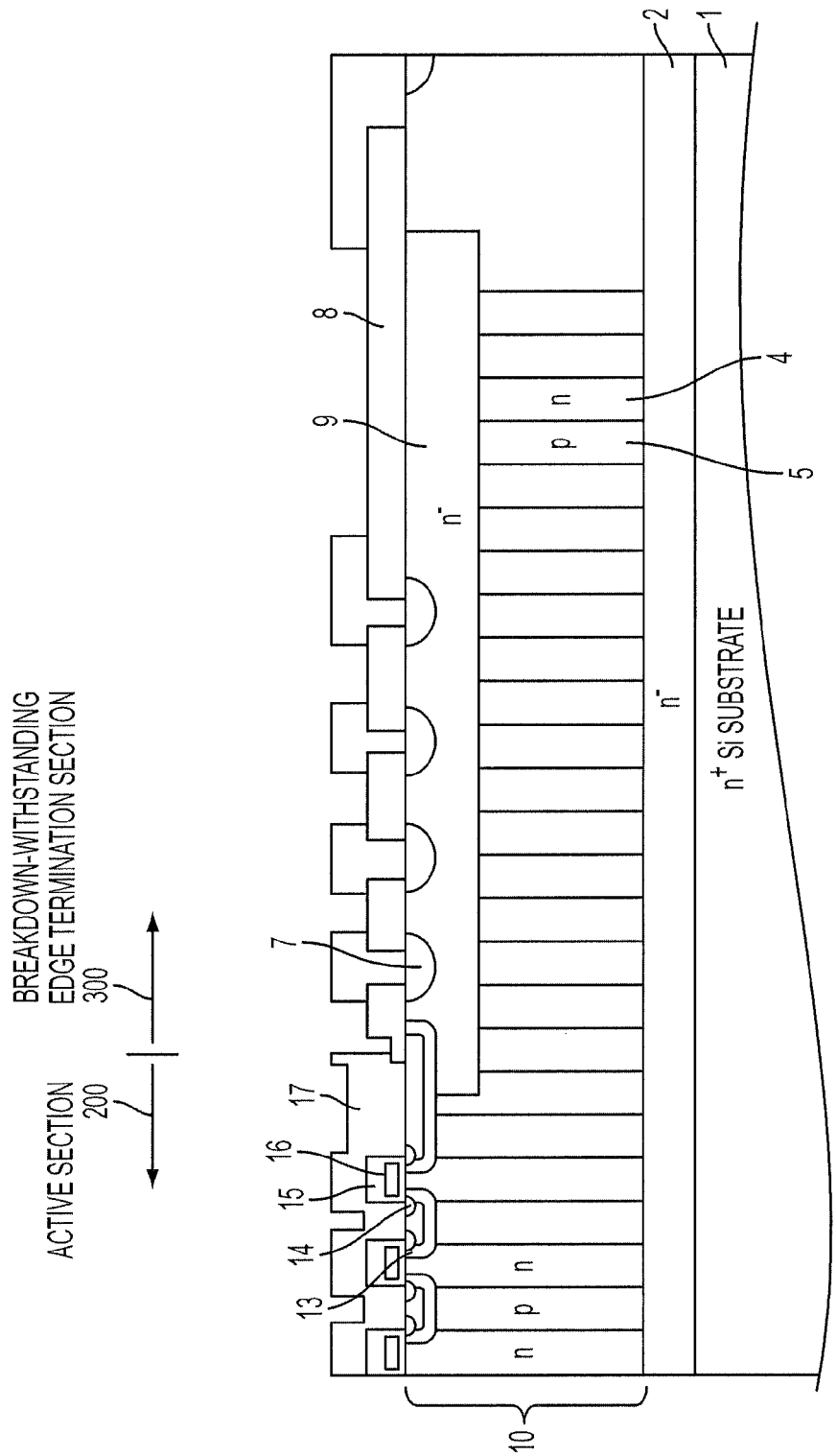
FIG. 9 is the cross sectional view of a super-junction MOSFET according to embodiments of the invention.

Then, in the same manner as the manufacturing process for forming a usual planar-type MOSFET shown in FIG. 9, that is the cross sectional view of a super-junction MOSFET according to the invention, field oxide film 8 is formed by thermal oxidation and gate insulator film 15 is formed. After a polysilicon layer is formed, gate electrode 16 is formed using the alignment mark described above. Boron ions are implanted using the polysilicon layer as a mask to form p-type base region 13 and guard ring 7. After n-type source region 14 is formed, source electrode 17 that covers the MOS gate is formed above the MOS gate with an interlayer insulator film interposed between source electrode 17 and the MOS gate. Source electrode 17 is in contact with n-type source region 14 and p-type base region 13.

Thus, p-type base region 13, n-type source region 14, gate insulator film 15, gate electrode 16, and source electrode 17 are formed in active section 200. A surface-side region including guard ring 7 and field insulator film 8 is formed in breakdown-withstanding edge-termination section 300.

Finally, the back surface side is polished and a drain electrode is formed. Thus, a super-junction MOSFET wafer is completed. Although the super-junction MOSFET in FIG. 9 is a planar-type one, the super-junction MOSFET in FIG. 9 may be a trench-type one with no problem.

In the above descriptions, a new alignment mark is formed in every two stages of epitaxial layer growth at a different position. Alternatively, a new alignment mark may be formed in every stage of epitaxial layer growth or in every three stages of epitaxial layer growth with no problem.

If the alignment mark in the first non-doped epitaxial layer is formed simultaneously with forming the opening for the boron-ion implantation as described above, it will be possible to reduce one photolithographic step.

In the above descriptions, the second alignment mark is formed by the pattering for the boron-ion-implantation into the third non-doped epitaxial layer. If boron ions are implanted into the entire non-doped epitaxial layer and patterning is employed for selective phosphorus-ion-implantation, the opening for forming the alignment mark may be formed simultaneously with the patterning for the selective phosphorus-ion-implantation.

Second Embodiment

Figure 8:
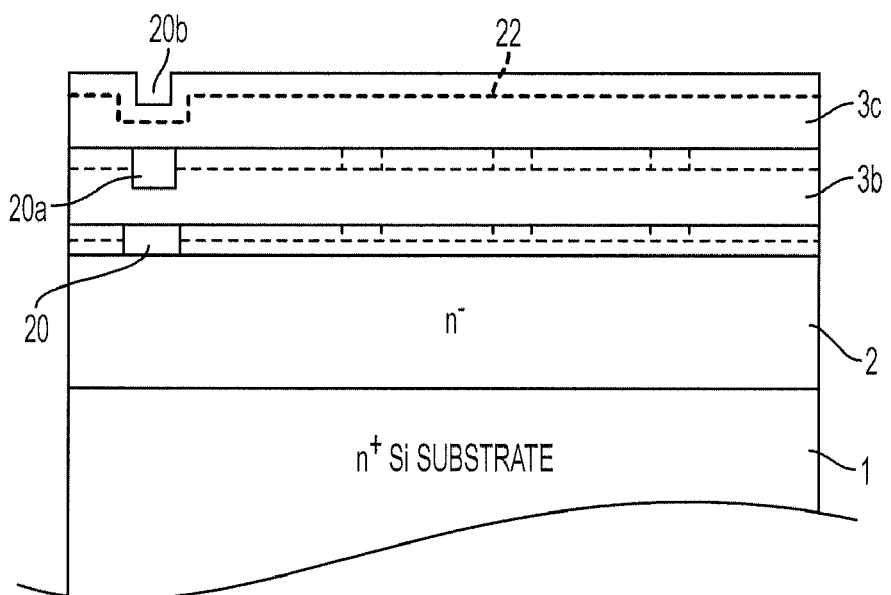
FIG. 8 is the cross sectional view of a super-junction semiconductor wafer describing a method of manufacturing the super-junction semiconductor wafer according to a second embodiment of the invention.

Now a method of manufacturing a super-junction semiconductor wafer according to a second embodiment of the invention will be described below with reference to FIG. 8.

After third non-doped epitaxial layer 3c is formed, first alignment mark 20 is transferred to the third non-doped epitaxial layer 3c surface via transferred alignment mark 20a in the second non-doped epitaxial layer 3b surface. Transferred alignment mark 20b transferred from transferred alignment mark 20a is narrower than transferred alignment mark 20a in the mark width thereof. Although not illustrated in FIG. 8, transferred alignment mark 20b is blunted more than transferred alignment mark 20a. If the width and the shape of transferred alignment mark 20b are brought back to the width and the shape close to the width and the shape of first alignment mark 20, mask alignment may be conducted with high positioning accuracy.

Now the method for shaping the transferred alignment mark 20b will be described below.

After third non-doped epitaxial layer 3c is formed, the third non-doped epitaxial layer 3c surface is etched for the depth of 0.5 μm as indicated by broken line 22 by the isotropic dry etching technique using the F radicals obtained by decomposing $CF_4$, $XeF_2$ and such a fluoride. As a result, the transferred alignment mark 20b width is expanded and made to be almost the same with the initial alignment mark 20 width. If transferred alignment mark 20b in the third non-doped epitaxial layer 3c surface is used with the expanded width thereof as a reference, the mask for the ion implantation will be patterned with high positioning accuracy.

According to the first and second embodiments of the invention, an alignment mark that facilitates mask alignment with high positioning accuracy is formed without increasing the manufacturing steps greatly. Therefore, the growth rate, at which the non-doped epitaxial layer is grown, is increased and the manufacturing costs, at which a super-junction semiconductor wafer necessary for manufacturing super-junction semiconductor devices is manufactured, are reduced.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A method of manufacturing a super-junction semiconductor device, the method comprising:
   growing an epitaxial layer above a heavily doped semiconductor substrate of a first conductivity type;
   forming an alignment mark in a surface of the epitaxial layer;
   implanting impurity ions of the first conductivity type or a second conductivity type into the entire epitaxial layer;
   patterning a resist by photolithography, the resist being used in selective impurity ion implantation into the epitaxial layer;
   implanting impurity ions of the second conductivity type or the first conductivity type selectively through the resist patterned;
   repeating a cycle comprising the growing, the implanting impurity ions into the entire epitaxial layer, the patterning, and the implanting impurity ions selectively through the resist patterned multiple times for forming a drift layer having a desired thickness, the drift layer comprising an alternating-conductivity-type-layer which comprises a first column of the first conductivity type and a second column of the second conductivity type, the first column and the second column extending in perpendicular to a substrate major surface, the first column and the second column being arranged alternately and repeatedly in parallel to the substrate major surface such that the first column and the second column are adjoining to each other;

conducting patterning for forming a new alignment mark simultaneously with patterning the resist used in the selective impurity ion implantation; and forming the new alignment mark at a position different from a position, at which the alignment mark in a preceding epitaxial layer is formed, the conducting patterning being conducted simultaneously with the patterning a resist by photolithography in every one or more repeated cycles, and the forming the new alignment mark being conducted subsequent to the conducting patterning and in advance of the implanting impurity ions selectively through the resist patterned in said every one or more repeated cycles.

2. The method according to claim 1, wherein the alignment mark or the new alignment mark is formed in a surface portion on a scribed line of a semiconductor wafer comprising one or more epitaxial layers above the semiconductor substrate, and the alignment mark or the new alignment mark comprises a trench 0.3 µm or less in depth.

3. A method of manufacturing a super-junction semiconductor device, the method comprising:

growing a non-doped epitaxial layer above a heavily doped semiconductor substrate of a first conductivity type;

forming an alignment mark in a surface of the non-doped epitaxial layer;

implanting impurity ions of the first conductivity type or a second conductivity type into the entire epitaxial layer;

patterning a resist by photolithography, the resist being used in selective impurity ion implantation into the epitaxial layer;

implanting impurity ions of the second conductivity type or the first conductivity type selectively through the resist patterned;

repeating a cycle comprising the growing, the implanting impurity ions into the entire epitaxial layer, the patterning, and the implanting impurity ions selectively through the resist patterned multiple times for forming a drift layer having a desired thickness, the drift layer comprising an alternating-conductivity-type-layer which comprises a first column of the first conductivity type and a second column of the second conductivity type, the first column and the second column extending in perpendicular to a substrate major surface, the first column and the second column being arranged alternately and repeatedly in parallel to the substrate major surface such that the first column and the second column are adjoining to each other; and etching the surface of the non-doped epitaxial layer, to which the alignment mark in the surface of a preceding non-doped epitaxial layer is transferred, by isotropic etching, the etching being conducted subsequent to the growing in every one or more repeated cycles.

4. The method according to claim 3, wherein an etching amount by the isotropic etching is 0.5 µm or less in depth from the surface of the non-doped epitaxial layer.

5. The method according to claim 1, wherein the growing an epitaxial layer is performed at least three times, and the conducting patterning and the forming the new alignment mark are performed for every two epitaxial layers, beginning with the third epitaxial layer.

* * * * *